United States Patent [19]
Asakura

[11] Patent Number: 5,742,479
[45] Date of Patent: Apr. 21, 1998

[54] CARD-TYPE ELECTRONIC DEVICE WITH PLASTIC FRAME SANDWICHED BETWEEN PRINTED CIRCUIT BOARD AND METAL PANEL

[75] Inventor: Tohru Asakura, Suwa, Japan

[73] Assignee: Seiko Epson Corporation, Tokyo, Japan

[21] Appl. No.: 601,459

[22] Filed: Feb. 14, 1996

Related U.S. Application Data

[63] Continuation of Ser. No. 401,568, Mar. 9, 1995, abandoned.

[30] Foreign Application Priority Data

Mar. 9, 1994 [JP] Japan ................................. 6-038316
Feb. 3, 1995 [JP] Japan ................................. 7-016640

[51] Int. Cl.[6] ............................. H05K 1/14; H01R 9/09
[52] U.S. Cl. .................. 361/737; 361/736; 361/752; 361/800; 361/728; 439/60
[58] Field of Search ........................ 361/730, 736, 361/737, 740, 741, 752, 756, 796, 799, 800, 802, 816, 818; 439/55, 60, 62; 174/35 GC, 35 R

[56] References Cited

U.S. PATENT DOCUMENTS

| | | | |
|---|---|---|---|
| 5,196,994 | 3/1993 | Tanuma et al. | 361/395 |
| 5,244,397 | 9/1993 | Anhalt | 439/101 |
| 5,319,516 | 6/1994 | Perkins | 361/220 |

FOREIGN PATENT DOCUMENTS

2305695  12/1990  Japan.

*Primary Examiner*—Leo P. Picard
*Assistant Examiner*—Jayprakash N. Gandhi
*Attorney, Agent, or Firm*—Loeb & Loeb LLP

[57] ABSTRACT

A card-type electronic device, such as a memory card, has a package structure in which a reduction in thickness is achieved while retaining the shielding effect and in which, if the device should be inserted incorrectly, no power source short-circuiting occurs without a mechanism for preventing incorrect insertion. The memory card 20 has a one-side-metal-plate type package structure and includes a plastic frame 11, a printed circuit board 12 which has a card contact edge section 14 for an input/output interface at an end thereof and on which semiconductor memory devices are mounted, and a metal panel 13. The plastic frame 11 is placed between the printed circuit board 12 and the metal plate 13. The distance $D_1$ between the card end surface 11a on that side of the card where the card contact edge section 14 is provided and the end 13a of the metal panel 13 on the same side of the card is set at a value that is larger than the distance A between the card end surface 11a on that side of the card where the card contact edge section 14 is provided and the contact position 8a of contact springs 8 of a card connector 7. If the memory card 20 is inserted in the reverse direction from the correct insertion direction, the contact sections 8a do not reach the metal panel 13, so that they are not brought into contact with the metal panel 13.

6 Claims, 7 Drawing Sheets

CARD-TYPE ELECTRONIC DEVICE WITH PLASTIC FRAME SANDWICHED BETWEEN PRINTED CIRCUIT BOARD AND METAL PANEL

This is a continuation of application Ser. No. 08/401,568, filed Mar. 9, 1995, now abandoned.

BACKGROUND OF THE INVENTION

1. Field of the Invention

The present invention relates to a card-type electronic device, such as a memory card and, in particular, to the package structure of a card-type electronic device of the type which has a card contact edge section for an input/output interface at an end thereof.

2. Description of the Related Art

As an example of a card-type electronic device, a memory card will be described. In a generally known conventional memory card package structure, a printed circuit board, on which memory devices, etc. are mounted, is contained in a shielding case comprising two (front and back) metal plates and a plastic frame. Adoption of a sandwich structure, in which the printed circuit board is placed between the two metal plates, proves particularly effective in protecting against radiation with EMI (electromagnetic interference) in the case of built-in memory devices such as SRAMs. Such a structure helps to protect data from deterioration, thereby attaining an improvement in terms of reliability.

However, the above-described memory card structure has the following problems:

(1) Due to the card structure in which the printed circuit board is sandwiched between the front and back metal plates, the card tends to be rather thick, which is rather inconvenient from the viewpoint of portability.

(2) To prevent power short-circuiting, which is caused when the card is inadvertently inserted incorrectly, e.g. in a positioned reversed from its intended insertion position, it is necessary to provide, for example, a shutter on the card body, or a reverse insertion protecting mechanism in the card connector. This leads to an inconsistency in standardization of the memory card and a hindrance to generalization of the memory card. Further, due to the resulting increased production time, a reduction in cost is difficult to achieve.

SUMMARY OF THE INVENTION

In view of the above problems, it is a first object of the present invention to provide a card-type electronic device in which a reduction in thickness is achieved while maintaining the requisite shielding effect.

A second object of the present invention is to provide a card-type electronic device in which a simple structure helps to prevent equipment damage, etc. when the card is inadvertently inserted in the reverse manner.

To achieve the above and other objects, there is provided, in accordance with the present invention, a card-type electronic device of the type which includes a plastic frame, a printed circuit board which has a card contact edge section for an input/output interface at an end thereof and on which semiconductor memory devices are mounted, and a metal panel, the plastic frame being sandwiched between the printed circuit board and the metal plate, wherein the distance $D_1$ between the card end surface which is on that side of the card where the card contact edge section is provided and the end of the metal panel which is on the same side of the card is set at a value that is larger than the distance A between this card end surface and a contact position of contact springs of a card connector. It is desirable that the distance $d_2$ between the card end surface which is on that side of the card which is remote from the side where the above-mentioned card contact edge section is provided and the end of the metal panel which is on the same side of the card be also set at a value that is larger than the above-mentioned distance A. Further, it is desirable that the distance $D_2$ between the card end surface which is on that side of the card which is remote from the side where the card contact edge section is provided and the end of the printed circuit board which is on the same side of the card be also set at a value that is larger than the above-mentioned distance A.

In accordance with the present invention, there is further provided a card-type electronic device wherein the above-mentioned printed circuit board is a multilayer printed circuit whose surface conductive layer has the above-mentioned card contact edge section and a grounding wiring pattern formed over substantially the entire remaining area thereof. In this regard, it is desirable that the above-mentioned grounding wiring pattern exhibit a number of slits that are formed along the dimension of the shorter or longer sides of the card. Further, it is desirable that the above-mentioned slits be discontinuous slits. It is also desirable that the above-mentioned multilayer printed circuit board have a power wiring pattern formed over substantially the entire area thereof as an internal conductive layer, and that the above-mentioned power wiring pattern have discontinuous slits which are formed along a dimension that is perpendicular to the discontinuous slits of the above-mentioned grounding wiring pattern.

The card-type electronic device of the present invention has a one-side-metal-plate-type package structure, so that the number of metal plates can be reduced, thereby achieving a reduction in device thickness. Further, the distance $D_1$, between the card end surface which is on that side of the card where the contact edge section is provided and the end of the metal panel on the same side of the card, is longer than the distance A between the card end surface on this side of the card contact edge section and the contact position of the contact springs of the associated card connector. Therefore, the contact position of the contact springs of the card connector does not reach the metal panel if the card-type electronic device is inadvertently inserted into the card connector in a reversed position. This means that electrical conduction between the contact springs does not occur. Therefore, no power short circuiting or signal short circuiting occurs if the body-side power source should be turned on in this state, the device only remaining in the non-operating state. In this way, power short-circuiting or the like can be avoided solely by appropriately determining the dimensions of the metal panel, so that no problem occurs if the card-type electronic device is reversely inserted, which means it is not necessary to provide a special reverse insertion protecting mechanism. Thus, it is possible to realize a card-type electronic device of low cost.

Further, when the distance $D_2$ between the card end surface which is on that side of the card which is opposed to the card side where the above-mentioned card contact edge section is provided and the end of the metal panel on the same side is also larger than the above-mentioned distance A, power short-circuiting or the like can be prevented even if the card is inserted into the card connector with the wrong side up, i.e., with the surface having no card contact edge section facing upwards.

Further, when the distance $d_2$ between the card end surface that is on that side of the card which is opposed to the above-mentioned card end surface, which is on the side where the card contact edge section is provided, and that end of the printed circuit board which is on the same card side is also larger than the above-mentioned distance A, the contact position of the contact springs of the associated card connector does not reach the printed circuit board if that end of the card which is remote from the side where the card contact edge section is provided should be inserted into the card connector, thereby preventing exfoliation of the insulating film (solder resist), power short-circuiting, etc.

The card-type electronic device of the present invention has a grounding wiring pattern in which a multilayer printed circuit board is used whose surface conductor layer substantially covers the entire range of the board. Due to this complete covering of the grounding wiring pattern, a shield case structure is substantially realized although a structure of one-side-metal-plate-type package structure is adopted, thereby obtaining an electrostatic shielding effect, a heat dissipation effect, etc. to a satisfactory degree. When the application sweep direction of the insulating film is adapted to the orientation of the multitude of slits formed on the grounding wiring pattern, any surplus insulating liquid is allowed to escape into the slits and accumulated therein, so that it is possible to secure the requisite uniformity and flatness of the insulating film. When the slits are discontinuous slits, the in-slit portions constitute thick-walled sections, so that a high level of film adhesiveness (adhesiveness of the solder resist and wiring pattern) is obtained by an anchoring effect, thereby preventing film exfoliation.

In a multilayer printed circuit board structure in which the power wiring pattern is formed substantially all over in the internal layer, and in which discontinuous slits oriented perpendicular to the dimension of the above-mentioned discontinuous slits are formed, the warpage of the layer of the grounding wiring pattern and the warpage of the power wiring pattern compensate for each other, with the result that the warpage can be restrained to a minimum, thereby making it possible to maintain the board flatness regardless of the change of temperature.

References herein to "up", "upward", "down", "downward", etc. are to be understood to be relative, and refer to the positional relation between the card contacts and the connector contact springs. In the embodiments illustrated and described herein, the contact springs are, by way of example, above the card contacts.

DESCRIPTION OF THE PREFERRED EMBODIMENTS

Embodiments of the present invention will now be described with reference to the accompanying drawings.

First Embodiment

Figure 1A:
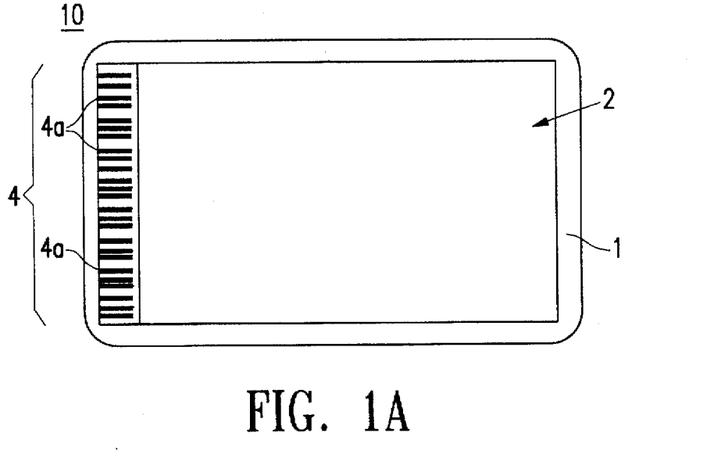
FIG. 1A is a top plan view showing a memory card according to a first embodiment the present invention.
Figure 1B:
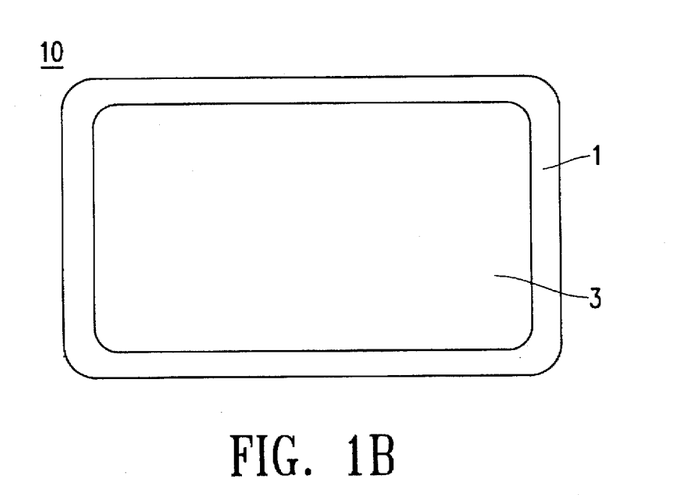
FIG. 1B is a bottom plan view of the memory card of FIG. 1A.
Figure 1C:
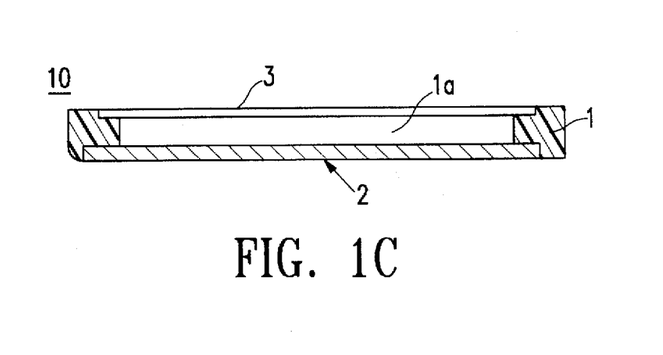
FIG. 1C is an elevational cross-sectional view along the longitudinal axis of the memory card of FIG. 1A, with the memory card inverted.
Figure 2A:
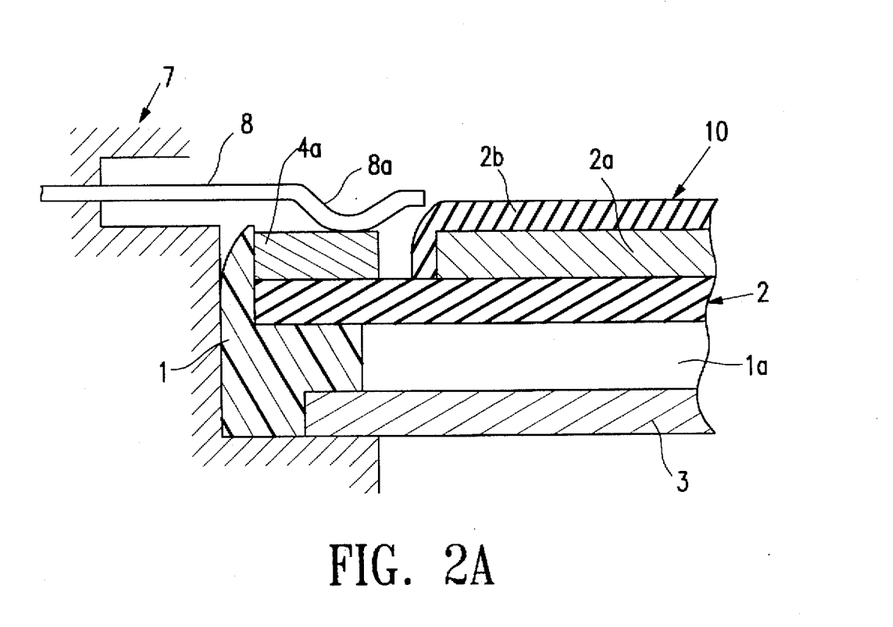
FIG. 2A is an elevational, cross-sectional detail view showing the memory card of FIGS. 1A-1C inserted into a card connector in the normal manner.
Figure 2B:
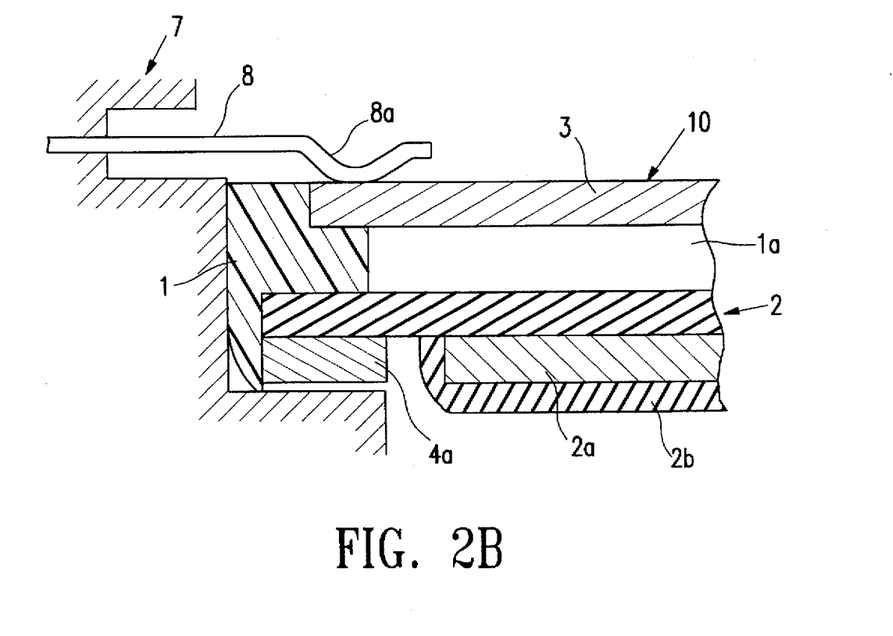
FIG. 2B is as a view similar to that of FIG. 2A showing the memory card inserted into the card connector wrong side up.

FIG. 1A is a plan view showing a memory card according to the first embodiment of the present invention; FIG. 1B is a bottom view of the memory card; and FIG. 1C is a cross-sectional view of the memory card. FIG. 2A is a sectional view showing the memory card of the first embodiment inserted into a card connector in the normal manner; and FIG. 2B is a sectional view showing the memory card inserted into the card connector wrong side up.

To enlarge the storage capacity of a memory card without creating any increase in the thickness thereof, it is necessary to secure a larger chip mounting space for the memory devices as compared with that in the prior art. In view of this, the first embodiment of the present invention adopts a one-side-metal-plate-type package structure as shown in FIGS. 1A, 1B and 1C. This memory card of one-side-metal-plate-type, indicated at 10, comprises: a plastic frame 1 of picture-frame-type having a substantially rectangular in-frame opening 1a; a printed circuit board 2 which is bonded to a frame step section on one side of the frame 1 by an adhesive, partial fitting, etc. to form the front surface of the card; and a metal panel, or plate, 3 which is bonded to a step section on the other side of the frame 1 by adhesive, partial fitting, etc. to form the back surface of the card. Frame 1 is composed of material forming four frame edges, or borders, which enclose opening 1a. A card contact edge section 4 for an input/output interface, in which a number of narrow and elongated printed patterns, e.g. terminal copper foil sections, 4a are arranged, is provided at an end of the printed circuit board 2. Semiconductor memory devices (SRAM, DRAM, EE-PROM, FLASH memory, or the like), which are not shown in FIGS. 1A, 1B, or 1C, are mounted on the printed circuit board 2, with their package sections being situated in the in-frame opening 1a. The metal panel 3 serves as a reinforcing plate which enhances the section modulus, torsional rigidity, etc. of the laminated structure to thereby inhibit deformation of the card, and, at the same time, provides electrostatic shielding. The metal panel 3 is electrically connected to grounding contact edges of the narrow, elongated printed patterns 4a for grounding through the intermediary of springs or the like (not shown) accommodated in the in-frame opening 1a of the plastic frame 1. The metal panel 3 can be kept at ground electric potential by inserting the memory card into a card connector.

FIG. 2A is a sectional view showing the memory card 10 correctly inserted into a card connector 7. When the memory card 10 is inserted into the card connector 7 in the normal manner, the card end surface which carries card contact edge section 4 abuts a step section in the card connector 7, and, at the same time, curved contact sections 8a of a plurality of contact springs 8 are brought into pressure contact with the corresponding narrow, elongated printed patterns 4a of the card contact edge section 4, thereby achieving an electrical connection between the memory card and the card connector. Printed circuit board 2 carries a wiring copper foil pattern (surface conductor layer) 2a and a board solder resist (insulating layer) 2b covering the wiring copper foil pattern 2a.

In this way, the back, or bottom, surface of the card is formed by the metal plate 3, and the front, or top, surface of the card is formed by the printed circuit board 2, so that the in-frame opening 1a, positioned between them, can be used as the memory chip accommodating space. Thus, it is possible to realize a memory card of a larger storage capacity without involving any increase in card thickness. Further, in spite of the structure of one-side-metal-plate-type package, it is possible to obtain substantially the same shielding effect as that of the structure of both-side-metal-plate-type packages.

However, the memory card structure of the first embodiment can have the following problems:

When, as shown in FIG. 2B, the memory card 10 is inserted wrong side up, the contact sections 8a of a plurality of contact springs 8 can be brought into pressure contact with the surface of the metal panel 3. In such a case, the metal panel 3 acts as a bridge connecting the plurality of contact springs 8 to each other, so that, if the user does not notice this reverse insertion, and turns on the power, power short-circuiting and signal-short-circuiting can occur, thereby sometimes causing the system to go down.

To eliminate such a power short-circuiting and signal short-circuiting, a reverse insertion preventing mechanism might be provided which allows the memory card 10 to be inserted into the card connector 7 only in the normal manner. However, provision of such a reverse insertion preventing mechanism would necessitate a change in the outer configuration of the card connector or that of the memory card, resulting in an inconsistency in the memory card standards and an obstruction to generalization of the memory card. Further, that would lead to an increase in production time and cost, thereby making it difficult to attain a reduction in cost.

Second Embodiment

Figure 3A:
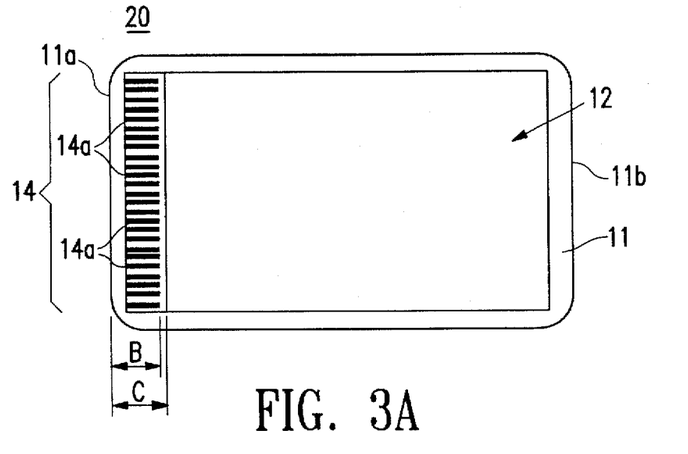
FIG. 3A op plan view showing a memory card according to a second embodiment of the present invention.
Figure 3B:
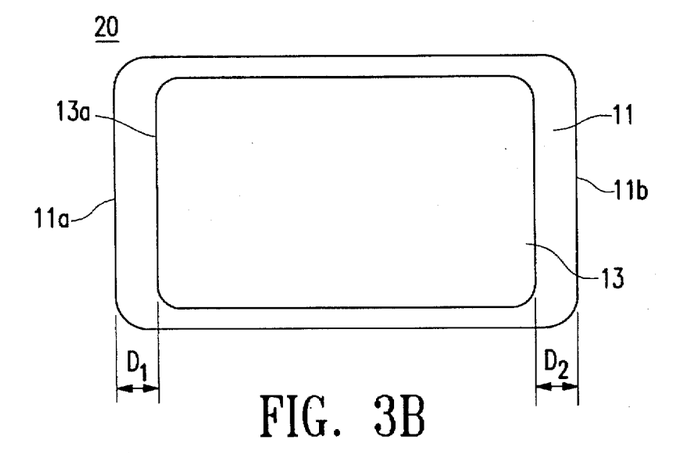
FIG. 3B is a bottom plan view of the memory card of FIG. 3A.
Figure 3C:
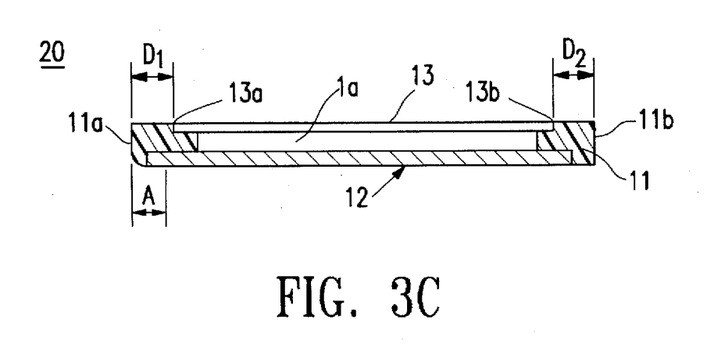
FIG. 3C is an elevational, cross-sectional view along the longitudinal axis of the memory card of FIG. 3A, with the memory card inverted.

In view of the above considerations, the memory card of the second embodiment of the present invention has a structure as shown in FIGS. 3A through 3C, of which FIG. 3A is a plan view showing a memory card according to the second embodiment of the present invention; FIG. 3B is a bottom view of the memory card; and FIG. 3C is a sectional view of the memory card.

The memory card 20 of this embodiment has a sandwich structure one side surface of which is formed by a metal plate. The memory card comprises: a plastic frame 11 of a substantially picture-frame-like configuration having an in-frame opening 1a; a printed circuit board 12 bonded to one side of the plastic frame 11 by adhesive, partial fitting, or the like to form the front, or top, surface of the memory card; and a stainless-steel plate (metal plate) 13 bonded to the other side of the plastic frame 11 by adhesive, partial fitting, or the like to form the back, or bottom, surface of the memory card and to serve as a reinforcing member. Provided at one shorter side edge portion of the printed circuit board 12 is a card contact edge section 14 for an input/output interface in which a plurality of narrow, elongated printed patterns (terminal copper foil sections) 14a are arranged. Mounted on the printed circuit board 12 are semiconductor memory devices (SRAM, DRAM, EE-PROM, FLASH memory or the like) that are not shown, with their package sections being situated in the in-frame opening 1a. The plastic frame 11 is made of a material consisting, for example, of a polycarbonate resin mixed with glass-type fibers, the material having a good electrically insulating property and a high level of strength. It is desirable that the printed circuit board 12 be formed as a board containing FR4 glass fiber, which excels in resistance to bending, distortion, etc. of the card. As stated above, the metal panel 13 serves both as a reinforcing plate which enhances the section modulus, torsional rigidity, etc. of the card to restrain deformation of the card and to provide electrostatic shielding. In this embodiment, the metal plate 13 is electrically connected to the grounding contact edges of the narrow, elongated printed patterns for grounding 14 through springs or the like (conducting members, not shown) accommodated in the in-frame opening 1a of the plastic frame 1, so that the metal panel 13 can be kept at ground potential by inserting the memory card into a connector.

Figure 4A:
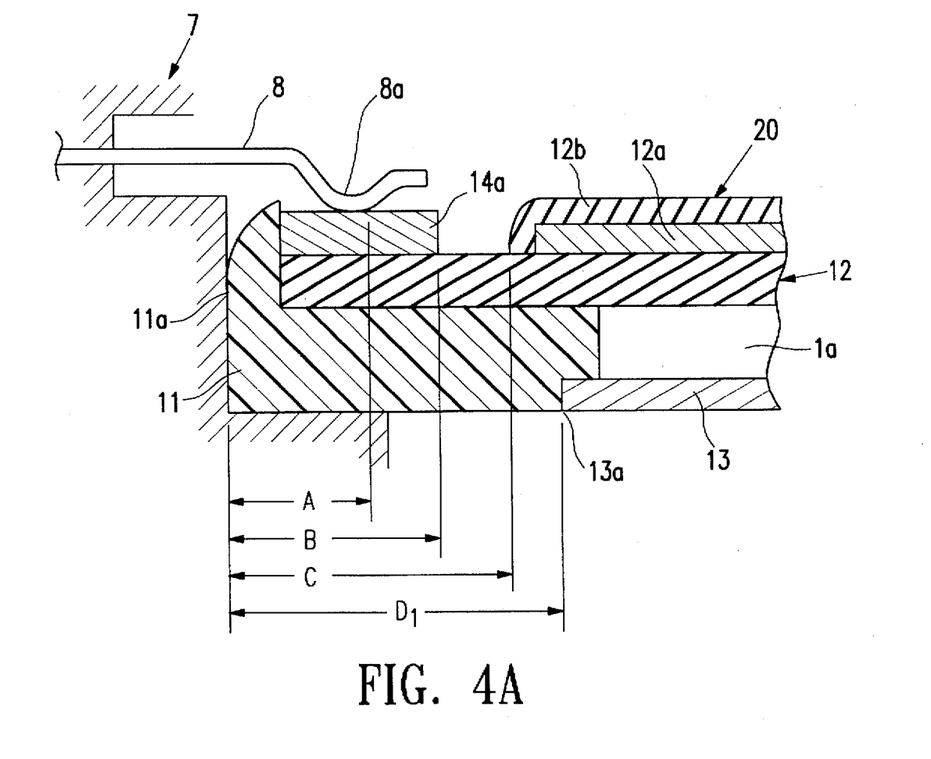
FIGS. 4A and 4B are views similar to those of FIGS. 2A and 2B, respectively, of the memory card shown in FIGS. 3A, 3B and 3C.

FIG. 4A is a sectional view showing the memory card 20 inserted into card connector 7. When the memory card 20 is inserted into the card connector 7 in the normal manner, the card end surface which carries card contact edge section 14 abuts a step in the card connector 7 and, at the same time, curved contact sections 8a of a plurality of contact springs 8 are brought into pressure contact with the corresponding narrow, elongated printed patterns 14a of the card connector edge section 14, thereby electrically connecting springs 8 to patterns 14a. The printed circuit board 12 carries a wiring copper foil pattern (surface conductor layer) 12a and a board resist (insulating film) 12b covering the wiring copper foil pattern (surface conductor layer) 12a.

In this embodiment, the distance $D_1$ between the shorter-side card end surface 11a on the side of the card contact edge section 14 and the end 13a of the metal panel 13 (frame width on the back side of the plastic frame 11) is set at a value larger than the distance A between the card end surface 11a and the contact position of sections 8a of contact springs 8 of the card connector (contact insertion depth). Further, the distance $D_2$ between the shorter-side card end surface 11b on the side remote from the card contact edge section 14 and the end 13b of the metal panel 13 is also set at a value larger than the above-mentioned distance A. In this embodiment, the distance $D_2$ is equal to the distance $D_1$. As shown in FIG. 3A, the distance B between the card end surface 11a and the edges of the narrow and elongated printed patterns of the card contact edge section 14 is longer than the distance A. Further, the distance C between the card end surface 11a and the edge of the board solder resist 12b coveting the wiring copper foil pattern 12a is larger than the distance B. Further, unlike ordinary resists, the board solder resist 12b serves also as a flat-surface decorating layer consisting, for example, of black resist.

Figure 4B:
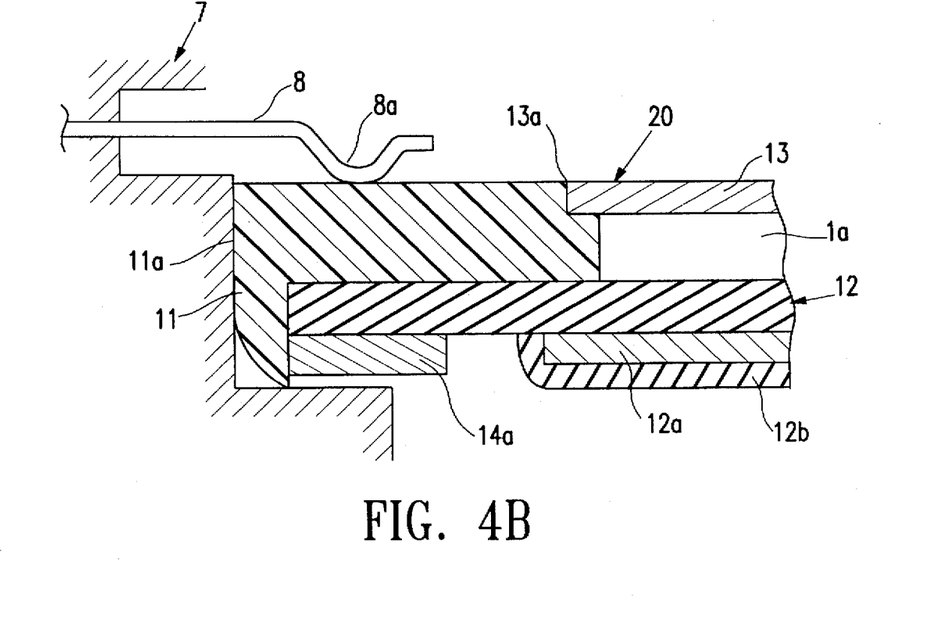

As described above, this embodiment uses a metal panel 13 in which the distance $D_1$ is larger than the distance A, so that, as shown in FIG. 4B, if the memory card 20 is inserted into the card connector wrong side up, the contact sections 8a of the contact springs 8 are in contact with the frame-edge section of the plastic frame 11, and are not in contact with the metal panel 13. Therefore, if the power source on the body side is turned on, no power short-circuiting or signal short-circuiting occurs between the plurality of contact springs 8. The wrong insertion only results in a non-operating condition being continued. It is only necessary for the distance $D_1$ to be set at a value larger than the distance A ($A<D_1$). However, if the condition: $A<B<C$ is necessarily established, it is not necessary for the condition: $C<D_1$ to be established. On the contrary, the condition: $A<D_1<C$ is desirable if the electrostatic shielding effect, reinforcing effect, etc. are to be maintained at the same level as in the prior art.

In this embodiment, the distance $D_2$ between the other card shorter-side end surface 11b, which is on the side remote from the shorter-side end surface which carries the card contact edge section 14, and the edge 13b of the metal panel 13 is also set at a value larger than the distance A, so that, if this shorter-side end is inadvertently inserted into the connector, power short-circuiting, etc. can be avoided.

Third Embodiment

Figure 5A:
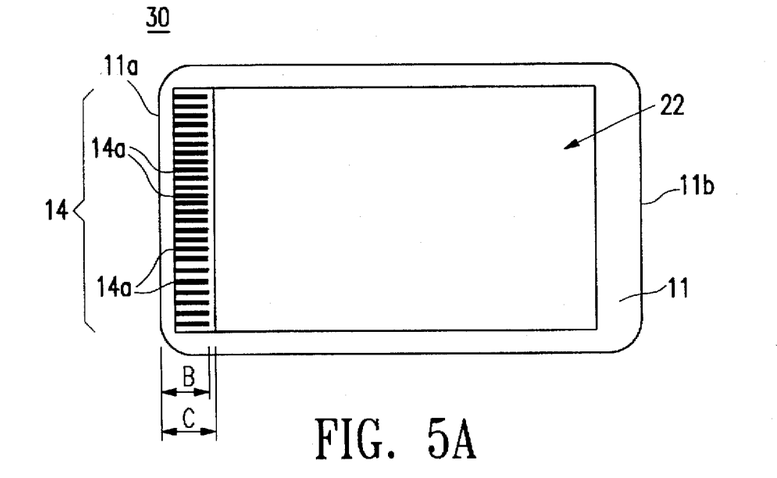
FIG. 5A is a top plan view showing a memory card according to a third embodiment of the present invention.
Figure 5B:
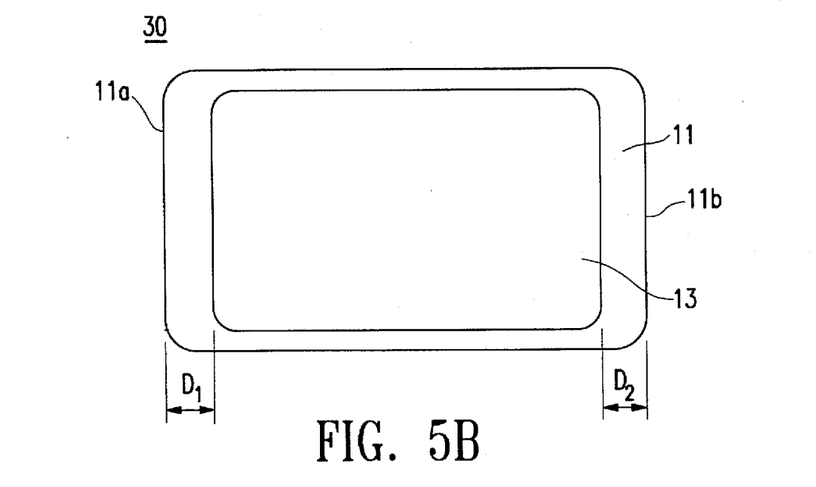
FIG. 5B is a bottom plan view of the memory card of FIG. 5A.
Figure 5C:
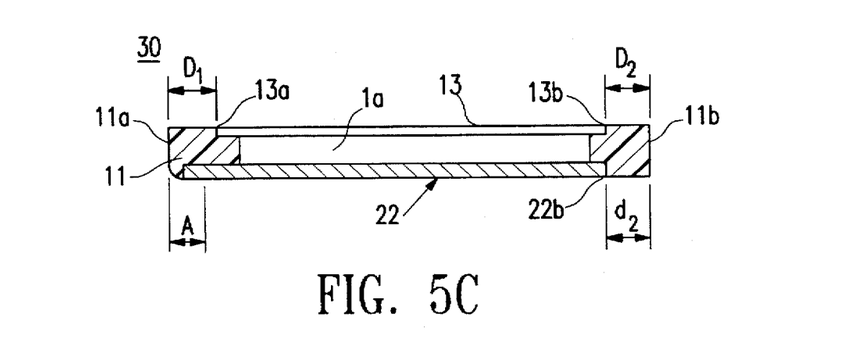
FIG. 5C is an elevational, cross-sectional view along the longitudinal axis of the memory card of FIG. 5A, with the memory card inverted.

FIG. 5A is a plan view showing a memory card according to the third embodiment of the present invention; FIG. 5B is a bottom view of the memory card; and FIG. 5C is a cross-sectional view of the memory card.

The memory card 30 of this embodiment has substantially the same construction as that of the second embodiment. However, as is apparent from FIG. 5C, the distance $d_2$ between the end 11b on the side remote from the card contact edge section 14 and the end 22b of the printed circuit board 22 is set at a value that is larger than the distance A between the card end surface 11a and contact sections 8a of contact springs 8 of the card connector (contact insertion depth).

In the second embodiment, the wiring copper foil pattern 12a, which is the outermost conductive layer of the multilayer printed circuit board 22, is covered with a board solder resist 12b. When the end 11b on the side remote from the card contact edge section 14 is frequently inserted into the card connector 7, a partial exfoliation of the board solder resist 12b is caused as a result of its press contact with the contact springs 8, resulting in power short-circuiting or the like. In this embodiment, however, if the end portion 11b, that is on the side remote from the card contact edge section 14, is inadvertently inserted into the card connector, the contact sections of the contact springs do not reach the end 22b of the printed circuit board 22, so that they are not brought into press contact with the board solder resist serving as the coating film of the printed circuit board 22. Thus, resist exfoliation or the like can be prevented.

Fourth Embodiment

Figure 6:
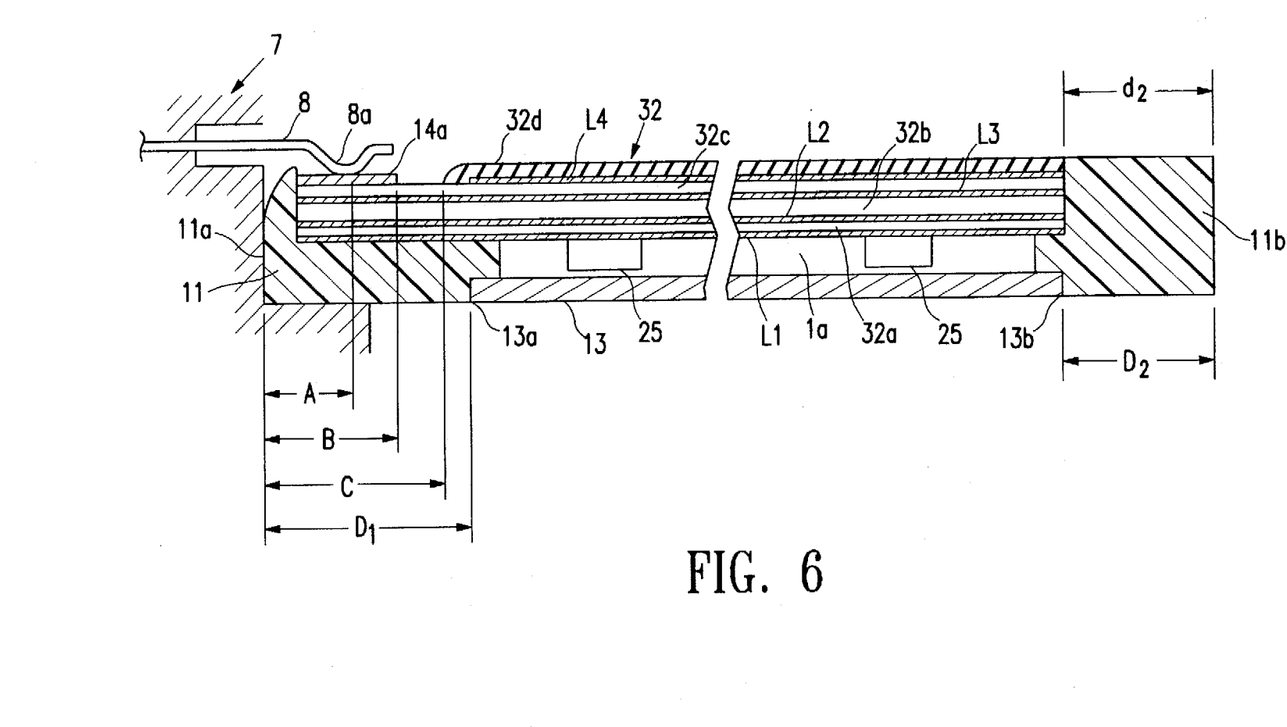
FIG. 6 is an elevational, cross-sectional view showing the end portions of a memory card according to a fourth embodiment of the present invention together with a card connector.

FIG. 6 is a sectional view showing a memory card according to the fourth embodiment of the present invention together with a card connector 7.

The package structure of this embodiment is substantially the same as that of the third embodiment. The printed circuit board 32 of this embodiment, however, is a multilayer printed circuit board having four conductor layers. That is, the printed circuit board 32 comprises: a first conductive layer L1 on which electronic parts, such as memory chips 25, are surface-mounted and which constitutes circuits such as a signal wiring pattern and a power wiring pattern; a second conductive layer L2 which is formed on the conductive layer L1 through the intermediary of an insulating layer 32a, such as a pre-preg, and which mainly constitutes a power wiring pattern P2 (FIG. 7C) for a power source $V_{DD}$; a third conductive layer L3 which is formed on the conductive layer L2 through the intermediary of an insulating layer 32b, such as a pre-preg, and which mainly constitutes a GND (grounding) wiring pattern P3 (FIG. 7B); a fourth conductive layer L4 which is formed on the conductive layer L3 through the intermediary of an insulating layer 32c, such as a pre-preg, and which mainly constitutes a GND (grounding) wiring pattern P4 (FIG. 7A); a narrow and elongated printed pattern (terminal copper foil section) 14a formed in the same layer as the grounding wiring pattern P4; and a board solder resist 32d covering the grounding wiring pattern P4.

Figure 7A:
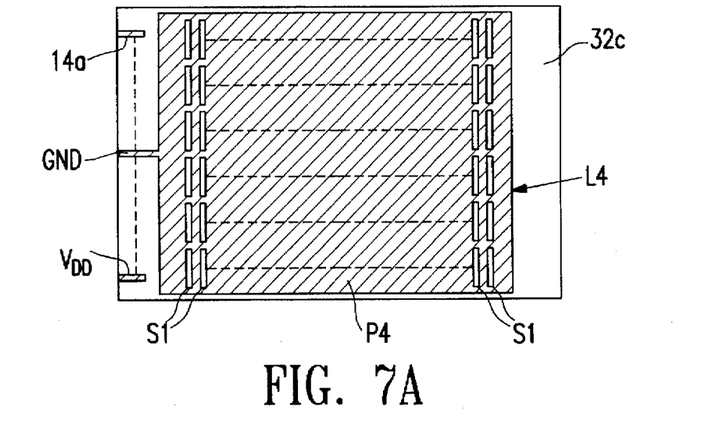
FIG. 7A is a top plan view showing a fourth layer pattern of a multilayer printed circuit board used in the fourth embodiment of the present invention.

As shown in FIG. 7A, the grounding wiring pattern P4 of the surface conductive layer L4 is formed in the range substantially covering the entire board surface, and discontinuous slits S1, extending parallel to the dimension of the shorter sides of the board, are arranged in the grounding wiring pattern P4 in such a way as to cover almost the entire surface area of the pattern. Only two rows of these slits S1 are shown at each end of the surface of pattern P4. The broken horizontal lines in FIG. 7A indicate that rows of slits are provided over the entire surface of pattern P4. The same is true for slits S1 in FIG. 7B and slits S2 in FIG. 7C.

Figure 7B:
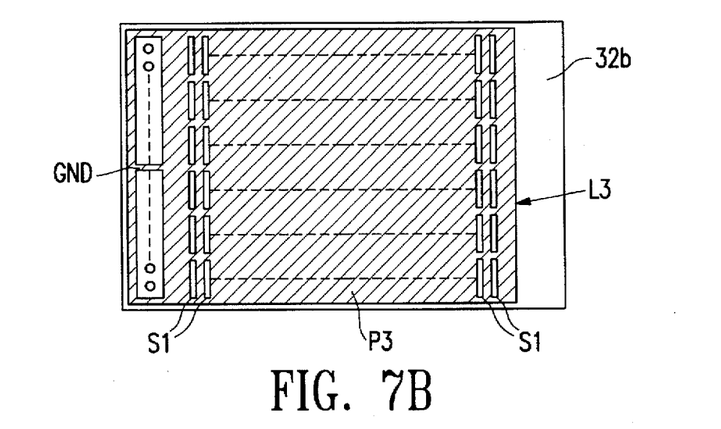
FIG. 7B is a top plan view showing a third layer pattern of the multilayer printed circuit board of the fourth embodiment.

Further, as shown in FIG. 7B, the grounding wiring pattern P3 of the inner conductive layer L3 is also formed in the range covering substantially the entire board surface, and discontinuous slits S1, formed along the dimension of the shorter sides of the board, are arranged in the grounding wiring pattern P3, as in the case of the grounding wiring pattern P4.

Figure 7C:
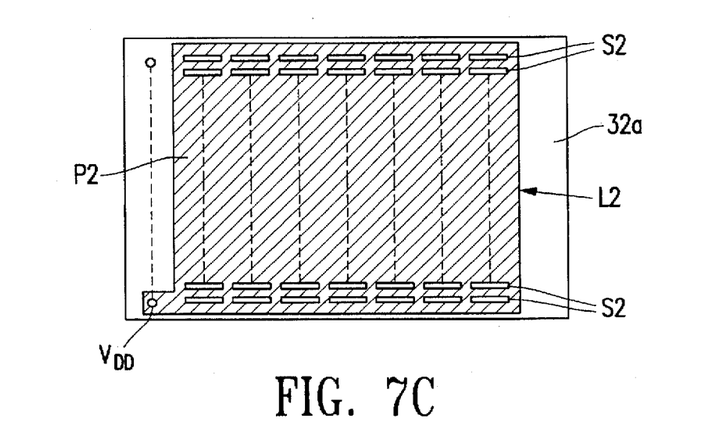
FIG. 7C is a top plan view showing a second layer pattern of the multilayer printed circuit board of the fourth embodiment.

As shown in FIG. 7C, the power wiring pattern P2 of the inner conductor layer L2 is also formed in a range covering substantially the entire board surface, and, as in the case of the grounding wiring pattern P4, discontinuous slits S2, formed along the dimension of the longer sides of the board, are arranged to cover almost the entire area of the pattern. The discontinuous slits S1 are perpendicular to the discontinuous slits S2.

In this embodiment, the front (the outer side) conductor layer is grounding wiring pattern P4 covering substantially the entire board area. This is advantageous from the viewpoint of electrostatic shielding effect and heat dissipating effect. Further, the sweep direction of the applicator used when applying the resist 32d is preferably parallel to the shorter sides of the boards. Thus, by forming the slits S1 so that they are parallel to the dimension of the shorter sides of the grounding wiring pattern P4, any surplus resist is allowed to escape into the slits S1 and accumulates therein, so that not only is it possible to secure the requisite uniformity and flatness of the applied resist film 32d, but the portions where the slits S1 are formed in pattern P4 constitute thick-walled sections of resist, whereby it is possible to attain a high level of film adhesiveness (inter-layer adhesiveness) due to the anchoring effect, thereby preventing film exfoliation. The slits are formed not continuously but discontinuously in a discrete fashion.

From the viewpoint of heat dissipating effect, it would be more desirable not to provide patterns P2, P3 and P4 with slits but to closely coat the entire surface with a surface conductive layer. However, to obtain a two-dimensional anchoring effect, it is more advantageous to form the discontinuous slits S1. Further, since a mesh-type conductive layer also provides the same electric shielding effect as a continuous layer, provision of the discontinuous slits S1 does not lead to a deterioration in shielding effect.

Since the coefficient of thermal expansion of the insulating layer 32c made of resin or FR4 is lower than the coefficient of thermal expansion of the grounding wiring pattern P4 formed thereon, a high temperature leads to a relative expansion at the side of the grounding wiring pattern P4, so that warpage is generated in the fourth layer mainly along the longer sides. Further, since the slits S1 are formed along the dimension of the shorter sides in the grounding wiring pattern P3, taking the interlayer connectivity of the surface layer and the grounding layer into account, a warpage along the dimension of the longer sides as in the grounding wiring pattern P4 is also generated in the third layer. However, in the power wiring pattern P2 of the second layer, a warpage is generated mainly in a direction perpendicular to that in the third and fourth layers due to the slits S2 formed along the dimension of the longer sides. Thus, the warpage components in these layers are balanced with each other, with the result that the overall warpage can be restrained to a minimum, thereby making it possible to maintain the flatness of the board irrespective of temperature changes.

As described above, the present invention provides a card-type electronic device having a one-side-metal-plate-type package structure, in which the distance $D_1$ between the card end surface on the card contact edge section side and the end of the metal panel on the same card side is larger than the distance A between the card end surface on the card contact edge section side and the contact sections of the contact springs of the associated card connector. This arrangement provides the following advantages:

(1) Due to the one-side-metal-plate-type package structure, it is possible to reduce the number of metal plates used, thereby attaining a reduction in device thickness. Further, if the card is inadvertently inserted in the wrong manner into the card connector, the contact sections of the contact springs of the card connector do not reach the metal panel, so that no electrical conduction occurs between the contact springs. Accordingly, if, in this condition, the body-side power source is turned on, no power short-circuiting or signal short-circuiting occurs, but the device only remains in a non-operating condition. By thus appropriately determining the dimensions of the metal panel, it is possible to avoid power source short-circuiting or the like, so that a reverse insertion of the card leads to no problem, thereby eliminating the need to provide a reverse insertion preventing mechanism. Thus, a card-type electronic device of low cost can be realized.

(2) Further, when the distance $D_2$ between the card end surface remote from the above-mentioned card end surface on the card contact edge section side and the end of the metal panel on the same card side is set at a value that is larger than the above-mentioned distance A, it is possible to prevent power short-circuiting or the like also when the side of the card remote from the card contact edge section side is inadvertently inserted.

(3) Further, when the side of the card remote from the card contact edge section side is inserted into the card connector, it is possible to avoid exfoliation of the insulating film on the printed circuit board, power short-circuiting, etc. because the distance $d_2$ to the end of the printed circuit board is set at a value that is larger than the above-mentioned distance A.

(4) In the one-side-metal-plate-type package structure of the present invention, a multilayer printed circuit board is used, the surface conductive layer of which is formed as a grounding wiring pattern substantially entirely covering the board area. Due to this entirely covering grounding wiring pattern, it is substantially possible to realize a shield case structure although a one-side-metal-plate-type package structure is adopted, thereby making it possible to obtain satisfactory electrostatic shielding effect and heat dissipating effect.

(5) In the structure in which a number of slits are formed in the grounding wiring pattern, it is possible for any surplus insulating agent to escape into these slits and accumulate therein by adapting the application sweep direction of the insulating film to the orientation of these slits, whereby it is possible to secure the requisite uniformity and flatness of the insulating film.

(6) When the slits are formed as discontinuous slits, the in-slit portions constitute thick-walled sections, so that a high level of interlayer adhesiveness due to an anchoring effect can be obtained, thereby preventing film exfoliation.

(7) In the multilayer printed circuit board structure in which a power wiring pattern is formed in the inner layer to cover substantially the entire area thereof, and in which discontinuous slits are formed along a dimension perpendicular to the above discontinuous slits, the warpage in the grounding wiring pattern layer and the warpage in the power wiring pattern act in such a way as to compensate for each other, with the result that the warpage can be restrained, thereby making it possible to maintain the board flatness under changing temperature conditions.

What is claimed is:

1. A card-type electronic device comprising: a plastic frame enclosing an in-frame opening, said frame having a front end surface and a rear end surface, said rear end surface being remote from said front end surface; a printed circuit board having an insertion end provided with a card contact edge section forming an input/output interface for connection to external contacts, said card contact edge section having a connector contact region for contacting the external contacts, said board carrying semiconductor devices and said insertion end facing toward said front end surface of said frame; and a metal panel, said plastic frame being sandwiched between said printed circuit board and said metal panel, and said metal panel having a front edge facing toward said front end surface of said frame, wherein said front end surface of said frame is spaced at a distance $D_1$ from said front edge of said metal panel and at a distance A from said connector contact region of said printed circuit board, and $A<D_1$.

2. A card-type electronic device according to claim 1, wherein said metal panel has a rear edge facing toward said rear end surface of said frame, said rear end surface of said frame is spaced at a distance $D_2$ from said rear edge of said metal panel, and $A<D_2$.

3. A card-type electronic device according to claim 2 wherein said printed circuit board has a surface area and comprises a multilayer printed circuit, said printed circuit includes a surface conductive layer, said surface conductive layer has a first portion constituting said card contact edge section and a second portion constituting a grounding wiring pattern, and said first and second portions cover substantially the entirety of said surface area.

4. A card-type electronic device according to claim 3, wherein said printed circuit board has mutually perpendicular first and second dimensions and said grounding wiring pattern is provided with a plurality of first mutually parallel slits, each of said first slits having a length dimension which is oriented parallel to said first dimension of said printed circuit board.

5. A card-type electronic device according to claim 4, wherein said first slits are arranged in a plurality of mutually parallel rows, each row is parallel to said first dimension of said printed circuit board, and each said row is composed of a plurality of said first slits which are separated from one another by portions of said surface conductive layer.

6. A card-type electronic device according to claim 5, wherein: said multilayer printed circuit further includes a power wiring pattern formed over substantially the entirety of said surface area as an internal conductive layer; said power wiring pattern is provided with a plurality of second mutually parallel slits, each of said second slits having a length dimension which is oriented parallel to said second dimension of said printed circuit board; said second slits are arranged in a plurality of mutually parallel rows, each row is parallel to said second dimension of said printed circuit board, and each said row is composed of a plurality of said second slits which are separated from one another by portions of said internal conductive layer.

* * * * *